US011170969B2

(12) United States Patent
Hamada et al.

(10) Patent No.: US 11,170,969 B2
(45) Date of Patent: Nov. 9, 2021

(54) ELECTRON BEAM OBSERVATION DEVICE, ELECTRON BEAM OBSERVATION SYSTEM, AND CONTROL METHOD OF ELECTRON BEAM OBSERVATION DEVICE

(71) Applicant: HITACHI HIGH-TECH CORPORATION, Tokyo (JP)

(72) Inventors: Koichi Hamada, Tokyo (JP); Megumi Kimura, Tokyo (JP); Momoyo Enyama, Tokyo (JP); Ryou Yumiba, Tokyo (JP); Makoto Sakakibara, Tokyo (JP); Kei Sakai, Tokyo (JP); Satoru Yamaguchi, Tokyo (JP); Katsumi Setoguchi, Tokyo (JP)

(73) Assignee: HITACHI HIGH-TECH CORPORATION, Tokyo (JP)

( * ) Notice: Subject to any disclaimer, the term of this patent is extended or adjusted under 35 U.S.C. 154(b) by 115 days.

(21) Appl. No.: 16/617,319

(22) PCT Filed: Mar. 30, 2018

(86) PCT No.: PCT/JP2018/013903
§ 371 (c)(1),
(2) Date: Nov. 26, 2019

(87) PCT Pub. No.: WO2019/021536
PCT Pub. Date: Jan. 31, 2019

(65) Prior Publication Data
US 2021/0125806 A1    Apr. 29, 2021

(30) Foreign Application Priority Data
Jul. 27, 2017  (JP) .............................. JP2017-145571

(51) Int. Cl.
*H01J 37/22*  (2006.01)
*H01J 37/10*  (2006.01)
(Continued)

(52) U.S. Cl.
CPC ............ *H01J 37/222* (2013.01); *H01J 37/10* (2013.01); *H01J 37/153* (2013.01); *H01J 37/22* (2013.01);
(Continued)

(58) Field of Classification Search
CPC .......... H01J 37/222; H01J 37/10; H01J 37/28; H01J 37/22; H01J 37/153; H01J 2237/221;
(Continued)

(56) References Cited

U.S. PATENT DOCUMENTS 5,500,527 A    3/1996  Zarubin
7,915,597 B2   3/2011  Huang et al.
(Continued)

FOREIGN PATENT DOCUMENTS

JP    2002-124205 A    4/2002
JP    2002-243428 A    8/2002
(Continued)

*Primary Examiner* — Kiet T Nguyen
(74) *Attorney, Agent, or Firm* — Miles & Stockbridge, P.C.

(57) ABSTRACT

Provided is an electron beam observation device that includes: an electron source; an objective lens concentrating an electron beam emitted from the electron source; and a control unit configured to perform control such that a plurality of images is generated by capturing images of a reference sample having a specific pattern, and a frequency characteristic is calculated for each of the plurality of images, in which an image is generated based on a secondary signal generated from a sample due to irradiation of the sample with the electron beam, and the control unit holds the plurality of frequency characteristics.

16 Claims, 13 Drawing Sheets

(51) Int. Cl.
*H01J 37/153* (2006.01)
*H01J 37/28* (2006.01)

(52) U.S. Cl.
CPC ....... *H01J 37/28* (2013.01); *H01J 2237/1536* (2013.01); *H01J 2237/221* (2013.01)

(58) Field of Classification Search
CPC ......... H01J 2237/282; H01J 2237/2816; H01J 2237/1536
USPC .......................................... 250/310, 306, 307
See application file for complete search history.

(56) References Cited

U.S. PATENT DOCUMENTS

| | | |
|---|---|---|
| 2002/0079448 A1 | 6/2002 | Ishitani et al. |
| 2004/0021845 A1 | 2/2004 | Kawahara |
| 2005/0247860 A1* | 11/2005 | Shishido ............... H01J 37/263 250/210 |
| 2005/0247884 A1 | 11/2005 | Nakamura et al. |
| 2011/0163230 A1* | 7/2011 | Hiroi ..................... H01J 37/265 250/310 |
| 2012/0019648 A1 | 1/2012 | Hoshino et al. |
| 2013/0248731 A1 | 9/2013 | Tanimoto et al. |
| 2016/0056014 A1* | 2/2016 | Yamamoto ............ H01J 37/222 250/307 |
| 2016/0057337 A1 | 2/2016 | Shimano et al. |
| 2017/0025251 A1 | 1/2017 | Enyama et al. |

FOREIGN PATENT DOCUMENTS

| | | |
|---|---|---|
| JP | 2004-063988 A | 2/2004 |
| JP | 2005-302359 A | 10/2005 |
| JP | 2013-196951 A | 9/2013 |
| JP | 2013-251212 A | 12/2013 |
| JP | 2014-197115 A | 10/2014 |
| JP | 2017-027829 A | 2/2017 |
| WO | 2010/084860 A1 | 7/2010 |

* cited by examiner

FREQUENCY CHARACTERISTIC A OF IMAGE CAPTURED BY DEVICE A (HORIZONTAL FREQUENCY)

FREQUENCY CHARACTERISTIC B OF IMAGE CAPTURED BY DEVICE B (HORIZONTAL FREQUENCY)

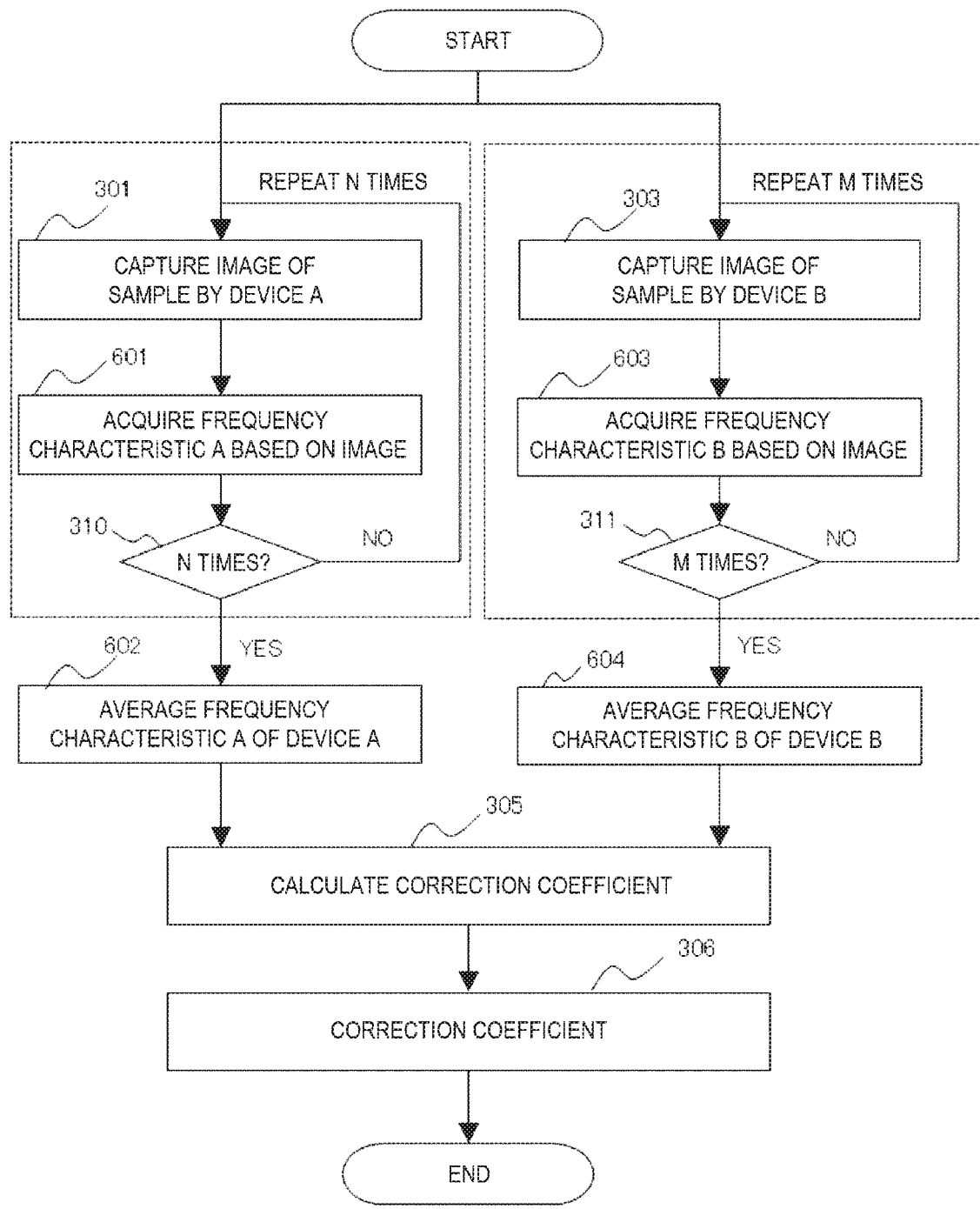

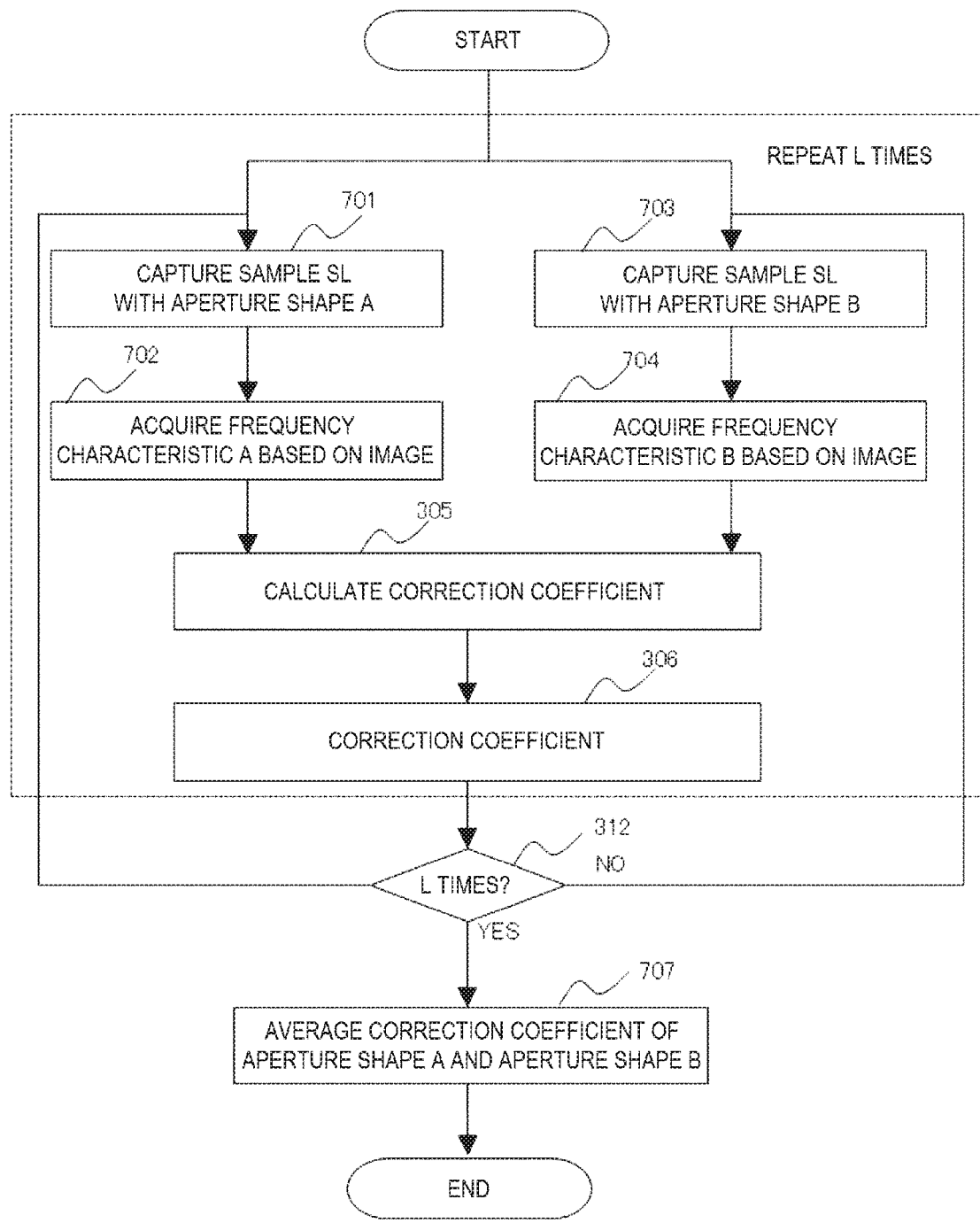

ELECTRON BEAM OBSERVATION DEVICE, ELECTRON BEAM OBSERVATION SYSTEM, AND CONTROL METHOD OF ELECTRON BEAM OBSERVATION DEVICE

CROSS-REFERENCE TO RELATED APPLICATIONS

The present application claims priority from Japanese Patent Application No. 2017-145571 filed on Jul. 27, 2017, the entire contents of which are hereby incorporated by reference.

TECHNICAL FIELD

The present invention relates to an electron beam observation device that performs inspection or measurement by using an electron beam.

BACKGROUND ART

An electron beam observation device, such as a scanning electron microscope (SEM) for observing, inspecting, or measuring a sample by using an electron beam, accelerates electrons emitted from an electron source, and concentrates the electrons by an electrostatic lens or an electromagnetic lens to irradiate a surface of a sample. The electrons are referred to as primary electrons.

The sample emits secondary electrons (in some cases, electrons with low energy are referred to as secondary electrons, and electrons with high energy are referred to as reflection electrons) due to the incidence of the primary electrons. The secondary electrons are detected while an electron beam is being deflected for scan, so that scanned images of fine patterns on the sample and a composition distribution of the sample can be obtained. Further, electrons absorbed by the sample are detected so that an absorption electric current image can also be obtained.

In a critical dimension-scanning electron microscope (CD-SEM) device that measures a dimension of a fine pattern of a semiconductor or the like from acquired images among electron beam observation devices, it is desirable that a difference (machine difference) in length measurement values between a plurality of devices is small. Until now, although efforts have been made to reduce the machine difference to an allowable range through a hardware adjustment or a software adjustment, an existing machine difference reduction method is approaching a limit with further miniaturization of the pattern of the semiconductor device or the like. In addition, a slight change in a shape of an electron beam or the like may occur due to the influence of aging after use of a device, use environment or the like, and a machine difference may exceed the allowable range.

A method for solving a change in a length measurement value due to a change in a shape of an electron beam by image correction has been proposed. For example, PTL 1 discloses a method in which a profile of a primary beam is estimated and image correction is performed based on the profile using Fourier transformation.

PRIOR ART LITERATURE

Patent Literature

PTL 1: JP-A-2017-27829

SUMMARY OF INVENTION

Technical Problem

However, in the example of related art, a method of accurately obtaining an intensity distribution of a primary beam used for the correction is not clarified. Since the scanning electron microscope in the related art forms an image of an electron source on a sample, the intensity distribution of the primary beam is determined by an electron source image, an optical aberration, a beam vibration and the like. Further, the influence of electron beam scattering in the sample also appears in an acquired image.

Since it is extremely difficult to accurately grasp a shape of an electron beam, it is not possible to reduce a machine difference with high accuracy by image correction. The invention solves the problem and proposes a method of reducing a machine difference with high accuracy.

Solution to Problem

The invention provides an electron beam observation device including an electron source; an objective lens concentrating an electron beam emitted from the electron source; and a control unit configured to perform control such that a plurality of images is generated by capturing images of a reference sample having a specific pattern, and a frequency characteristic is calculated for each of the plurality of images, in which an image is generated based on a secondary signal generated from a sample due to irradiation of the sample with the electron beam, and the control unit holds the plurality of frequency characteristics.

Advantageous Effect

According to the invention, a machine difference (image difference) between a plurality of devices caused by a difference in a shape of an electron beam (electron beam) can be reduced by processing a captured image.

BRIEF DESCRIPTION OF DRAWINGS

FIG. 5 is a flow chart showing an example of processing for calculating a correction coefficient based on frequency characteristics according to a modification of the first embodiment of the invention.

FIG. 6 is a flow chart showing an example of processing for calculating a correction coefficient based on frequency characteristics according to a seventh embodiment of the invention.

DESCRIPTION OF EMBODIMENTS

Hereinafter, embodiments of the invention will be described with reference to the drawings. Hereinafter, a scanning electron microscope will be described as an example of an electron beam observation device, but the invention can also be applied to an electron beam observation device other than the scanning electron microscope.

First Embodiment

Figure 1:
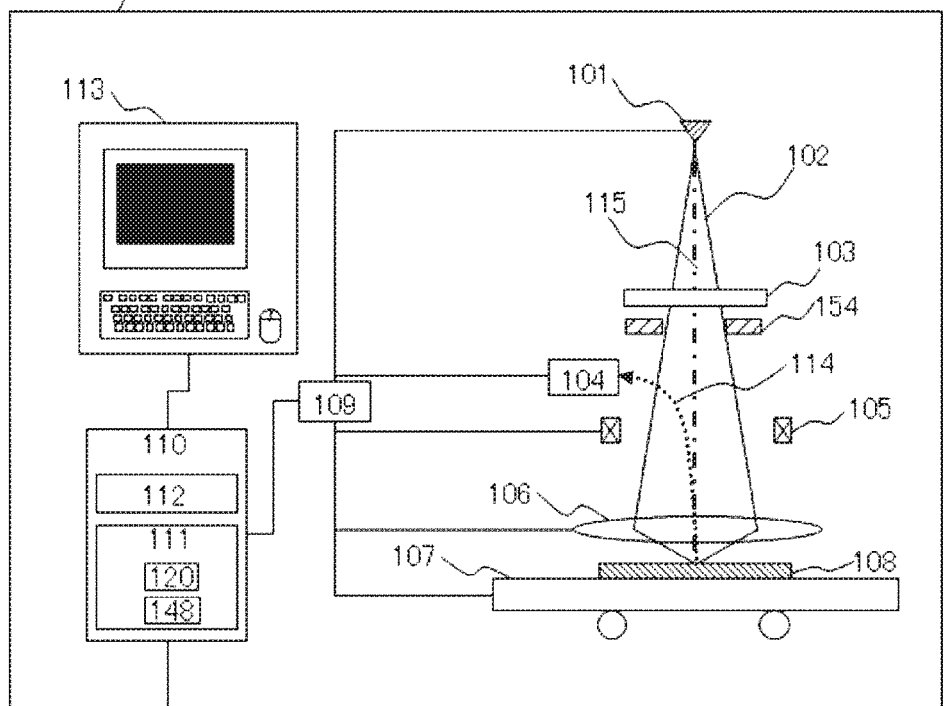
FIG. 1 is a block diagram showing an example of a scanning electron microscope according to a first embodiment of the invention.

FIG. 1 is a block diagram showing a schematic configuration of an electron beam observation device according to a first embodiment. The illustrated example shows an electron beam observation system in which an electron beam observation device 1-B is connected to an electron beam observation device 1-A. Since the electron beam observation device 1-A and the electron beam observation device 1-B have the same configuration, only the electron beam observation device 1-A will be described. When the electron beam observation device 1-A and the electron beam observation device 1-B are not specified, a reference sign "1" is used with those after "-" being omitted.

First, the configuration of the device will be described. In a downstream direction (downward in the figure) where an electron source (electron gun) 101 emits an electron beam (electron beam) 102, a modified illumination aperture 103, an aperture plate 154, a detector 104, a deflector for scanning deflection 105, and an objective lens 106 are disposed. Further, an aligner for adjustment of a central axis (optical axis) of a primary beam, an aberration corrector and the like (not shown) are added to an electronic optical system.

Although the objective lens 106 according to the first embodiment is an electromagnetic lens that controls the focus with an excitation current, the objective lens 106 may be an electrostatic lens, or may be a combination of an electromagnetic lens and an electrostatic lens.

A stage 107 is configured to move with a wafer, that is, a sample 108 placed thereon. The electron source 101, the detector 104, the deflector for scanning deflection 105, the objective lens 106, and the stage 107 are connected to a control device 109. Further, the control device 109 is connected to a system control unit 110.

The system control unit 110 functionally includes a storage device 111 and a calculation unit 112. An input and output unit 113 including an image display device is connected to the system control unit 110. Further, although not shown in the figure, it goes without saying that constituent elements other than a control system and a circuit system are disposed in a vacuum container and are evacuated to operate. It goes without saying that a wafer transfer system configured to place a wafer, from outside vacuum, onto the stage 107 is provided.

More specifically, the system control unit 110 includes a central processing unit as the calculation unit 112 and a storage unit as the storage device 111. The central processing unit serving as the calculation unit 112 executes a control program 120, an image processing unit 148 or the like stored in the storage device 111, so as to perform image processing related to defect inspection and dimensional measurement or control the control device 109. The image processing unit 148 is a program for processing an SEM image.

In the first embodiment, the system control unit 110, the input and output unit 113, the control device 109 and the like may be generally referred to as a control unit. Further, the input and output unit 113 may be configured such that an input member such as a keyboard or a mouse serves as an input unit, and a display member such as a liquid crystal display device serves as an input unit and an output unit separately; and the input and output unit 113 may also be an integrated input and output unit utilizing a touch panel or the like.

Image observation by the device according to the first embodiment will be described. An electron beam 102 emitted by the electron source 101 is focused by the objective lens 106 and concentrated on the sample 108 with an extremely small beam diameter.

The deflector for scanning deflection 105 is controlled by the control device 109 such that the electron beam 102 scans a predetermined region of the sample 108. The electron beam 102, which has arrived at a surface of the sample 108, interacts with materials in the vicinity of the surface. Accordingly, secondary electrons such as reflection electrons, secondary electrons and Auger electrons are generated from the sample and become a signal to be acquired.

The first embodiment shows a case where the signal is a secondary electron. A secondary electron 114, generated from a position where the electron beam 102 has arrived at the sample 108, is detected by the detector 104. Signal processing is performed on the secondary electron 114 detected by the detector 104 in synchronization with a scan signal sent from the control device 109 to the deflector for scanning deflection 105, so that an image (SEM image) is generated and observation of the sample 108 is conducted.

The generated image can be stored in the storage device 111 or a nonvolatile storage device (not shown). The image stored in a storage unit such as the storage device 111 or the nonvolatile storage device is processed by an image processing unit 148 to be described later.

In the first embodiment, the detector 104 is disposed upstream of the objective lens 106 and the deflector for scanning deflection 105, but the order of arrangement may be reversed. Further, although not shown, an aligner for correcting an optical axis of the electron beam 102 is disposed between the electron source 101 and the objective lens 106, so that correction can be performed when a central axis of the electron beam 102 is shifted with respect to an aperture or the electronic optical system.

When measuring a dimension of a pattern of the sample 108 based on the acquired image in the electron beam observation device 1-A and the electron beam observation device 1-B (hereinafter, device A and device B), it is desirable that a difference (machine difference) in length measurement values between a plurality of devices is small.

In an example in the related art, efforts have been made to reduce the machine difference to an allowable range through a hardware adjustment or a software adjustment on each constituent element described in FIG. 1. However, a slight difference in a shape of an electron beam or the like may occur due to the influence of aging after use of the device A and device B, use environment or the like, and a machine difference exceeding the allowable range may occur.

In the first embodiment, a method of reducing the machine difference between the device A and the device B by image processing in the image processing unit 148 in FIG. 1 is proposed. In the first embodiment, processing for reducing the machine difference between the device A and the device B will be described.

The first embodiment shows an example in which the device A is taken as a reference device, and an image captured by the device B is corrected so as to have the same frequency characteristics as that of the device A. The device A and the device B are described as separate devices, but the device A and the device B may be the same. In this case, the device A can be treated as the device B by a time change, or by changing a shape of the aperture plate 154 in the device A, and the like.

Figure 2:
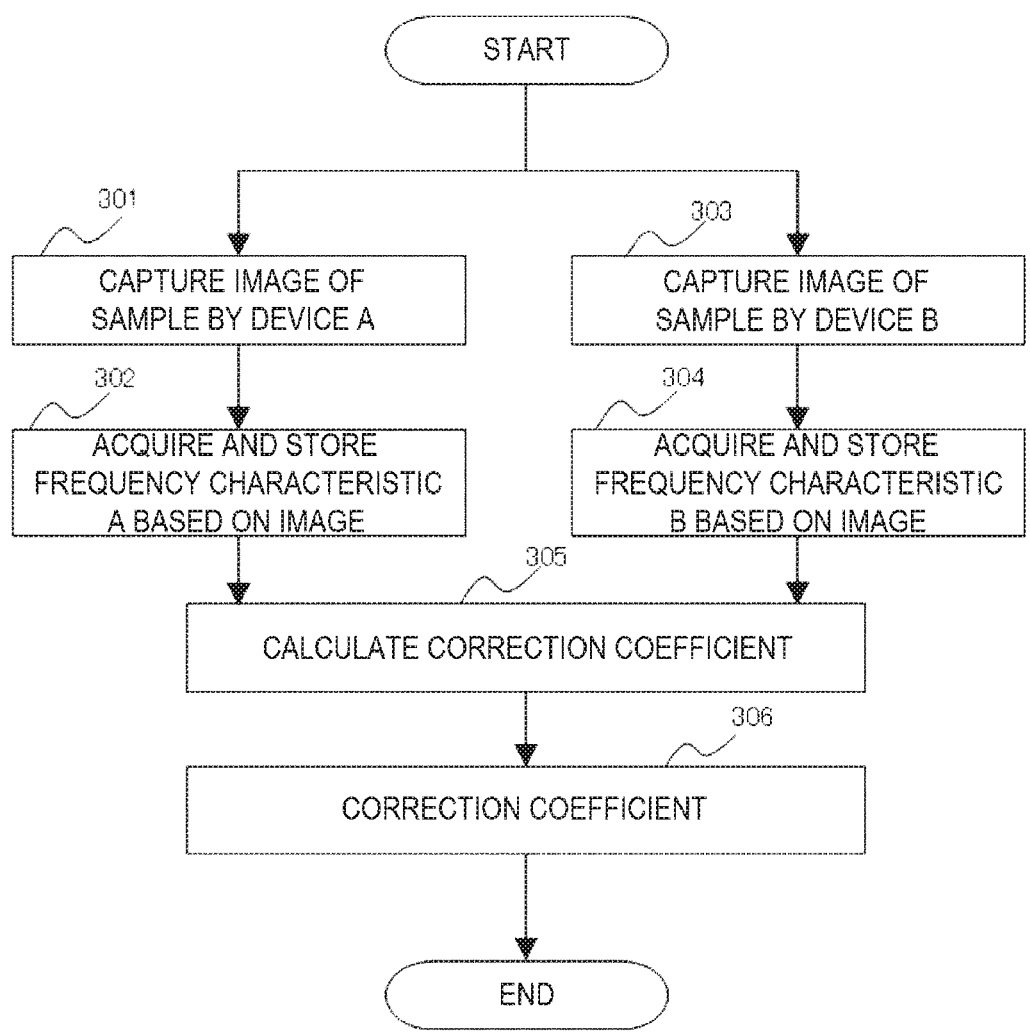
FIG. 2 is a flow chart showing an example of processing for calculating a correction coefficient based on frequency characteristics according to the first embodiment of the invention.

The image processing unit 148 calculates a correction coefficient based on each image captured by the device A and the device B, and corrects an image based on the calculated correction coefficient. FIG. 2 is a flow chart showing an example of a procedure for calculating the correction coefficient.

The device A serving as a reference device captures a plurality of (one or more) SEM images of the sample (reference sample) 108 having a specific pattern (301). The device A calculates a frequency characteristic A of the image by performing Fourier transformation or the like on each captured image (302).

The frequency characteristic can be calculated by multiplication or division of coefficients for each coefficient generated when the image is converted into a frequency space image.

Similarly, the device B captures a plurality of (one or more) SEM images of the sample (reference sample) 108 having a specific pattern (303). The device A calculates a frequency characteristic B of the image by performing Fourier transformation on each captured image or the like (304). The sample having a specific pattern is preferably the same sample.

In consideration of matching the device B with the device A using the device A as the reference device, a correction coefficient is calculated as correction coefficient=frequency characteristic A of device A/frequency characteristic B of device B (Equation 1) (305). The correction coefficient is calculated for each pixel after the image is converted into a frequency domain. The first embodiment shows an example in which the device B acquires the frequency characteristic A of the device A and calculates the correction coefficient. The frequency characteristic A of the image captured by the device A may be calculated by the device B.

The frequency characteristic can be acquired from a single image, but the frequency characteristics of a plurality of captured images may be averaged to reduce the influence of a variation in a value due to noise or the like. Further, in order to reduce the variation in a value due to noise of the frequency characteristics or the like, smoothing processing may be performed on the calculated frequency characteristics.

FIG. 2 shows an example in which the frequency characteristic is acquired from a single image, and a processing procedure as shown in FIG. 5 is used when a plurality of images are used. FIG. 5 shows a modification according to the first embodiment and is a flow chart showing an example of processing for calculating a correction coefficient based on a plurality of frequency characteristics.

The device A captures an SEM image of the sample (reference sample) 108 having a specific pattern (301), repeats processing for calculating a frequency characteristic A based on the image (601) N times (310), and calculates an average frequency characteristic A based on N frequency characteristics A (602).

Similarly, the device B capture an SEM image of the sample 108 having a specific pattern (303), repeats processing for calculating a frequency characteristic B based on the image (603) M times (311), and calculates an average frequency characteristic B based on M frequency characteristics B (604).

N images are captured by the device A and a plurality of images are captured by the device B, and the average frequency characteristic A of the device A and the average frequency characteristic B of the device B (602, 604) are obtained separately. Both of N and M are an integer value of 1 or more which is set in advance.

An average of the frequency characteristics means an average of amplitude characteristics at each frequency. A correction coefficient calculation (306) method is the same as the processing procedure in FIG. 3.

Figure 3:
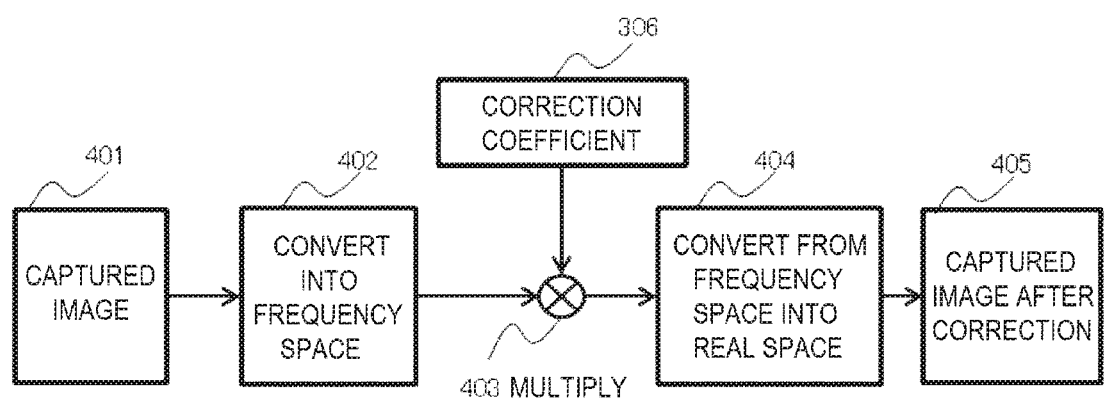
FIG. 3 is an illustrative diagram showing an example of an image correction method according to the first embodiment of the invention.

Next, image correction processing will be described with reference to FIG. 3. FIG. 3 is an illustrative diagram showing an example of an image correction method.

An example is shown in which an image captured by the device B is corrected using the correction coefficient (306) and is converted into the same frequency characteristics as that of the device A. A captured image 401 captured by the device B is converted into a frequency space image 402 using a technique such as Fourier transformation.

The device B acquires the correction coefficient (306) calculated by the device A, and multiplies (403) each pixel of the frequency space image 402 by the correction coefficient (306). The frequency space image 402 multiplied by the correction coefficient (306) is converted into a real space image 404 again by a known or well-known technique such as a two-dimensional inverse FFT (Fourier transformation), and is output as a corrected image 405. Since the corrected image 405 is corrected so as to have the same frequency characteristic as that of the device A, the machine difference between the device B and the device A is reduced.

Figure 9:
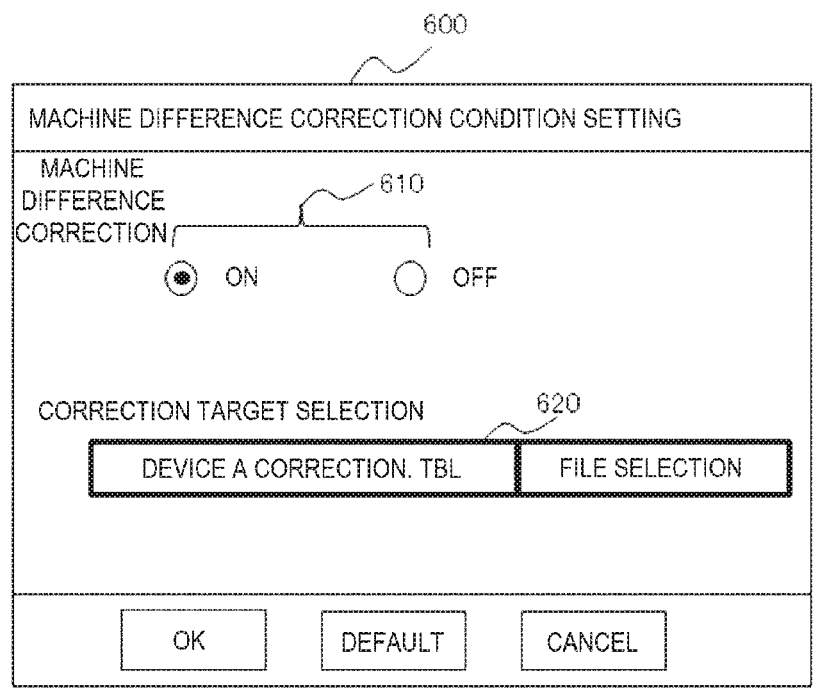
FIG. 9 is a GUI schematic diagram showing an example of an image correction setting screen according to the first embodiment of the invention.

FIG. 9 shows an example of a Graphical User Interface (GUI) for performing image correction environment setting. FIG. 9 is a diagram showing an example of an environment setting screen 600 output to the image display device of the input and output unit 113. The setting screen 600 includes a switch 610 for setting whether to correct the machine difference by ON or OFF, and a correction target 620 for setting a device to be corrected.

At the time of capturing, the switch 610 sets whether to execute an image correction (machine difference correction). At this time, a file can be specified as the correction target 620 as to which device the frequency characteristic is to be matched.

The correction target 620 specified on the environment setting screen 600 is assumed to be a file in which frequency characteristics to be corrected are recorded. By providing the environment setting screen 600 as described in the first embodiment, it is possible to set presence or absence of image correction and the correction target. A display unit of the input and output unit 113 may be shared as a GUI.

As described above, according to the first embodiment, a plurality of images of the sample having a specific pattern are captured by the reference device A, and the plurality of images are acquired. The space frequency characteristics of each of these images are acquired by using Fourier transformation or the like, and the space frequency characteristic A of the device A is obtained by statistically processing the space frequency characteristics.

Next, the device B captures a plurality of images of the sample having the same pattern as the one when the device A is used, so as to acquire the plurality of images. The space frequency characteristics of each of these images are acquired by using Fourier transformation or the like, and the space frequency characteristic B of the device B is obtained by statistically processing the space frequency characteristics.

By comparing the space frequency characteristic A and the space frequency characteristic B, a correction coefficient for frequency correction of an image is calculated. The machine difference between the device A and the device B is reduced by correcting the captured images of either device so that there is no difference between the space frequency characteristic A and the space frequency characteristic B. It has been experimentally found that a difference in length measurement values can be reduced by matching the frequency characteristics between the devices to the same characteristic. The machine difference between a plurality of devices can be reduced, and an operation management at a site having a plurality of devices can be accurately performed.

The sample 108 having the same pattern is preferably used as a sample that is actually subjected to length measurement processing, but another pattern may be used as long as a frequency component contained in the image is similar to that of the image used for the length measurement processing. In addition, the sample used for calculating the correction coefficient and the sample used for the length measurement may be the same or different.

Second Embodiment

A method of reducing a machine difference between the device A and the device B is described in the first embodiment, and it is desirable that an image obtained by the device A serving as the reference includes components having a frequency as high as possible.

The fact that the image does not include a high frequency component means that the image is blurred, and conversely, the fact that the image includes a large number of high frequency components means that the image is clear. Therefore, image of the same pattern (sample 108) are captured by using a plurality of devices, the frequency components of each of the images are compared, and the device including the largest number of high frequency components is used as a reference device.

Figure 4A:
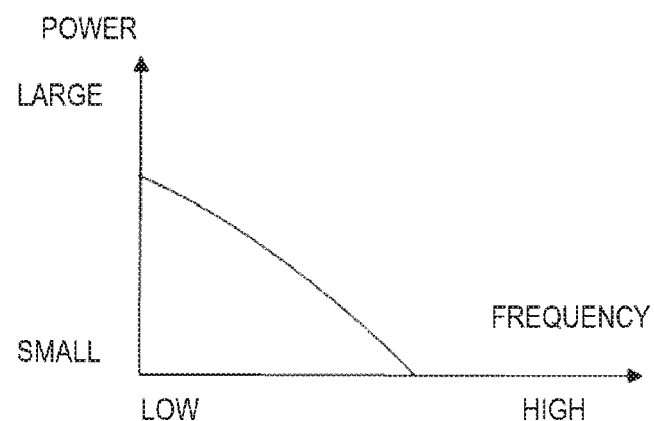
FIG. 4A is a graph showing a frequency characteristic of a device A according to a second embodiment of the invention.
Figure 4B:
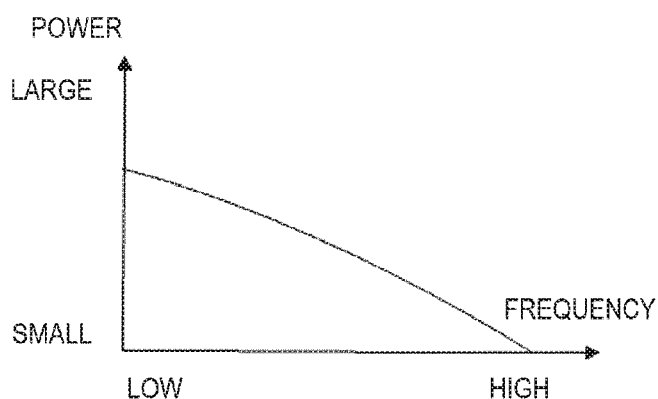
FIG. 4B is a graph showing a frequency characteristic of a device B according to the second embodiment of the invention.
Figure 7:
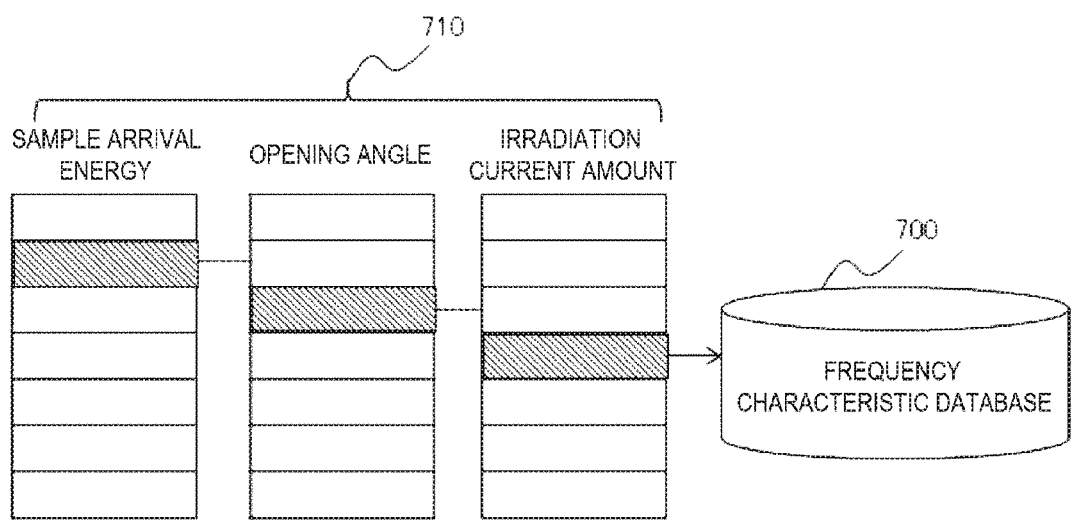
FIG. 7 is an illustrative diagram showing an example of an image correction method according to an eighth embodiment of the invention.

FIGS. 4A and 4B are graphs showing examples of frequency characteristics. FIG. 4A is a graph showing the frequency characteristic A of the device A, and FIG. 4B is a graph showing the frequency characteristic B of the device B. The frequency characteristic A and the frequency characteristic B in the illustrated examples show a relationship between a frequency and a power (amplitude), but the invention is not limited thereto.

In FIGS. 4A and 4B, only a power with respect to a horizontal frequency is shown for explanation. As shown in these figures, when an image acquired by the device B has a power remaining in a portion having a high frequency with respect to an image acquired by the device A, image processing in which the device B is the reference device and the device A is matched to the device B may be performed.

Whether there is a power in a region having a high frequency can be determined, for example, by a power magnitude of a portion having a high frequency as the frequency characteristic, or can be determined by an existing method such as comparing a magnitude of an output of a high pass filter.

Figure 10:
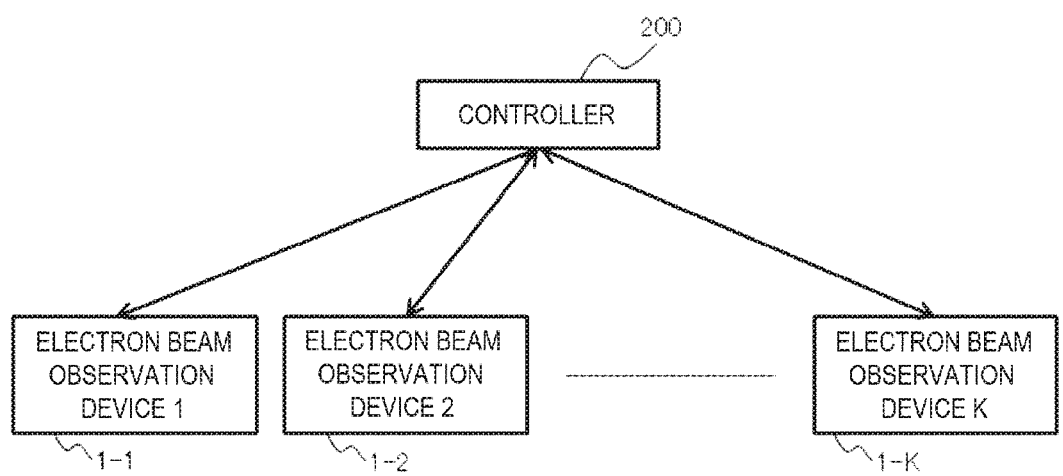
FIG. 10 is a block diagram showing an example of an electron beam observation system for managing a plurality of electron beam observation devices according to the second embodiment of the invention.

FIG. 10 is a diagram showing a schematic configuration of an electron beam observation system according to a second embodiment. A controller 200 that manages a plurality of electron beam observation devices having a configuration shown in FIG. 1 is provided. The controller 200 holds a reference frequency characteristic for adjusting the machine difference using the invention, and transmits the reference frequency characteristic to each device depending on a request from each of devices 1-1 to 1-K. In each device, the frequency characteristic of the captured image is matched to the reference frequency characteristic.

In each of the devices 1-1 to 1-K, a correction coefficient is calculated based on the reference frequency characteristic acquired from the controller 200 and the frequency characteristic of the image captured by each of the devices 1-1 to 1-K, and the image is corrected based on the correction coefficient.

According to the second embodiment, the machine difference between a plurality of devices 1 can be reduced, and an operation management in the electron beam observation system having the plurality of devices 1 can be accurately performed.

Further, for each of the devices 1-1 to 1-K, a numerical sequence indicating the frequency characteristic may be calculated and held. As the numerical sequence indicating the frequency characteristic, for example, amplitude of a two-dimensional FFT can be used.

Third Embodiment

In the invention, it is not essential to match a machine difference using a specific device as a reference device. Since only a frequency characteristic of an image is required to reduce the machine difference, it is possible to capture a specific pattern (reference sample) by a plurality of devices, use an average value of the frequency characteristics of each image as a reference frequency characteristic, and calculate a correction coefficient using the reference frequency characteristic.

Fourth Embodiment

As described in the third embodiment, since only a frequency characteristic of an image is required to reduce a machine difference, a device that captures an image may be an electron beam observation device 1 having a different configuration. The sample 108 having a specific pattern is captured by each device, and a correction coefficient may be calculated based on frequency characteristics of the images.

Further, by storing the frequency characteristic of the image, it is possible to use the same device for the purpose of detecting a time change (aging) of an electron beam, and it is possible to reduce the time change of the electron beam by an image correction. Even when a component is replaced for maintenance, a change in a shape of the electron beam due to, for example, a replacement of the aperture plate 154 or the electron source 101 can be reduced by the image correction.

Fifth Embodiment

The first embodiment shows that the influence of a difference in a shape of an electron beam on an image can be reduced based on a frequency characteristic of an image acquired from a captured image. In the first embodiment, an image correction is performed for the purpose of reducing a machine difference between devices. In addition to this, when the same device has a plurality of aperture plates 154 and is used by switching the plurality of aperture plates 154, the image correction can also be used for the purpose of matching a frequency characteristic of an image captured at another aperture plates 154 to a frequency characteristic of an image captured at the specific aperture plate 154.

In the present specification, all designs and setting conditions for determining a shape of an electron beam to be applied to the sample 108, such as a sample arrival energy of an electron beam, an opening angle on the sample 108, a sample irradiation current amount, and an optical magnification, including an aperture shape are set as optical conditions. In a fifth embodiment, an example in which only the aperture shape is switched will be described.

It can be used, for example, when an aperture shape giving priority to a resolution is different from an aperture shape suitable for capturing the sample 108 having a deep groove. By capturing one or more images with the aperture shape giving priority to the resolution, frequency characteristics of the images in a case of using the aperture are acquired. After changing to the aperture for deep groove capturing, one or more images of the same pattern are captured so as to acquire frequency characteristics of the images.

If a correction coefficient for reducing a difference in the frequency characteristics acquired from these images is calculated in the same manner as in the first embodiment, in subsequent capturing, the frequency characteristic of the image captured with one aperture can be corrected to the frequency characteristic of the image captured with the other aperture.

Sixth Embodiment

The amplification (magnification) of the electron beam observation device 1 may be different between a time of calculating the correction coefficient and a time of correcting an image. Since a correction coefficient has a coefficient for each frequency, the image correction may be performed after appropriately scaling the correction coefficient in a frequency direction according to a ratio of the magnification at the time of calculating the correction coefficient and the magnification at the time of correcting the image.

The coefficient for each frequency includes a frequency, intensity (amplitude or power) and a phase for each pixel. Since the phase is not used in a sixth embodiment, the phase can be eliminated.

Seventh Embodiment

A seventh embodiment shows an example in which a plurality of correction coefficients are calculated, and the plurality of correction coefficients are averaged.

The fifth embodiment shows an example in which a correction coefficient for correcting a frequency characteristic of an image captured with a specific aperture shape (aperture shape A) to a frequency characteristic of an image captured with another aperture shape (aperture shape B).

In the seventh embodiment, in order to reduce the influence of a variation in a value due to noise or the like, a plurality of correction coefficients may be prepared and averaged, and a method thereof is a processing procedure as shown in FIG. 6.

FIG. 6 is a flow chart showing an example of processing for calculating a correction coefficient based on frequency characteristics. The device A captures an SEM image of the sample 108 having a specific pattern with the aperture shape A (701), and calculates the frequency characteristic A based on the image (702).

The device B captures an SEM image of the sample 108 having a specific pattern with the aperture shape B (703), and calculates the frequency characteristic B based on the image (704).

The device A acquires the frequency characteristic B of the device B and calculates the correction coefficient in the same manner as in the first embodiment (306). After repeating step 701 to step 704 and step 306 a predetermined L times (312), an average value of the correction coefficients calculated in step 306 is calculated as an average correction coefficient (707).

A difference from FIG. 5 according to the first embodiment is that the device A and the device B have a difference between the aperture shape A and the aperture shape B, and the correction coefficient is calculated and then averaged. By setting an average value obtained by repeating calculation of the correction coefficient (306) L times as an average correction coefficient of the aperture shape A and the aperture shape B 707, the influence of a variation in a value can be prevented.

Eighth Embodiment

An eighth embodiment shows an example in which a correction coefficient is calculated based on frequency characteristics of images captured under optical conditions other than a plurality of aperture shapes by the same device and with the same aperture shape.

The fifth embodiment shows that a frequency characteristic of an image captured with one aperture shape can be corrected to a frequency characteristic of an image captured with the other aperture shape. A frequency characteristic of an image captured under a certain optical condition can be corrected to a frequency characteristic of an image captured under a different optical condition by the same device and with the same aperture shape.

For example, with respect to frequency characteristics of images captured under an optical condition (small current mode) that prioritizes a resolution over an irradiation current and an optical condition (large current mode) that prioritizes that the irradiation current is larger than the resolution by the same device and with the same aperture shape, images having the same pattern are acquired under the small current mode and the large current mode, and a correction coefficient is acquired in the same manner as in the fifth embodiment. Accordingly, the frequency characteristic of the image captured under the large current mode can be corrected to the frequency characteristic of the image acquired under a high resolution mode.

In correction processing when the optical condition is changed, the frequency characteristic of the image for each optical condition are held in a device as a database 700 in association with an optical condition 710 as shown in FIG.

7, such that the device 1 reads data corresponding to the optical condition 710 of the frequency characteristic of an image to be corrected and the optical condition 710 of the frequency characteristic of a corrected image from the database 700, calculates a correction coefficient, and corrects the frequency characteristic of the image.

When an image of an optical condition that does not exist in the database 700 is corrected, a correction coefficient may be calculated before capturing and stored in the database 700, or a corresponding correction coefficient may be estimated from the image frequency characteristic of the near optical condition 710. Patterns of these images are the same, and are acquired under a capturing condition or a condition where dose amounts of the images are equal. The data in the database 700 may be held as the correction coefficient.

Ninth Embodiment

The eighth embodiment shows that a correction coefficient can be calculated for frequency characteristics of images captured under a plurality of optical conditions, and the frequency characteristics can be corrected. Since brightness of an image and an SN ratio are different for each optical condition, a reference (capturing condition) may be provided for an image used for calculation of the correction coefficient.

The capturing condition is a condition set when capturing such as a magnitude of an image to be captured, a frame cumulative number when a plurality of captured images are cumulated to form a single image, and a scanning speed.

For example, when an image used for calculating a correction coefficient under any optical condition is within a reference range in which a total dose amount of an image is set in advance, the frame cumulative number is increased since an irradiation current amount per pixel under a small current mode is small. Conversely, under a large current mode, the irradiation current amount per pixel is large, but a risk of a pattern shape change due to adhesion of irradiation contamination to a surface of the sample 108 is high, so that capturing may be performed by reducing the frame cumulative number.

Although a ninth embodiment has been described on the assumption that capturing conditions satisfying a reference dose amount are selected from the optical conditions set before capturing, after capturing under any capturing condition, an image that does not satisfy the reference range may be determined not to be used for correction coefficient calculation.

Tenth Embodiment

The eighth embodiment shows an example in which frequency characteristics of an image for each optical condition are stored as the database 700. A tenth embodiment shows an example in which an error image is determined and excluded from images stored in the database 700.

Figure 8:
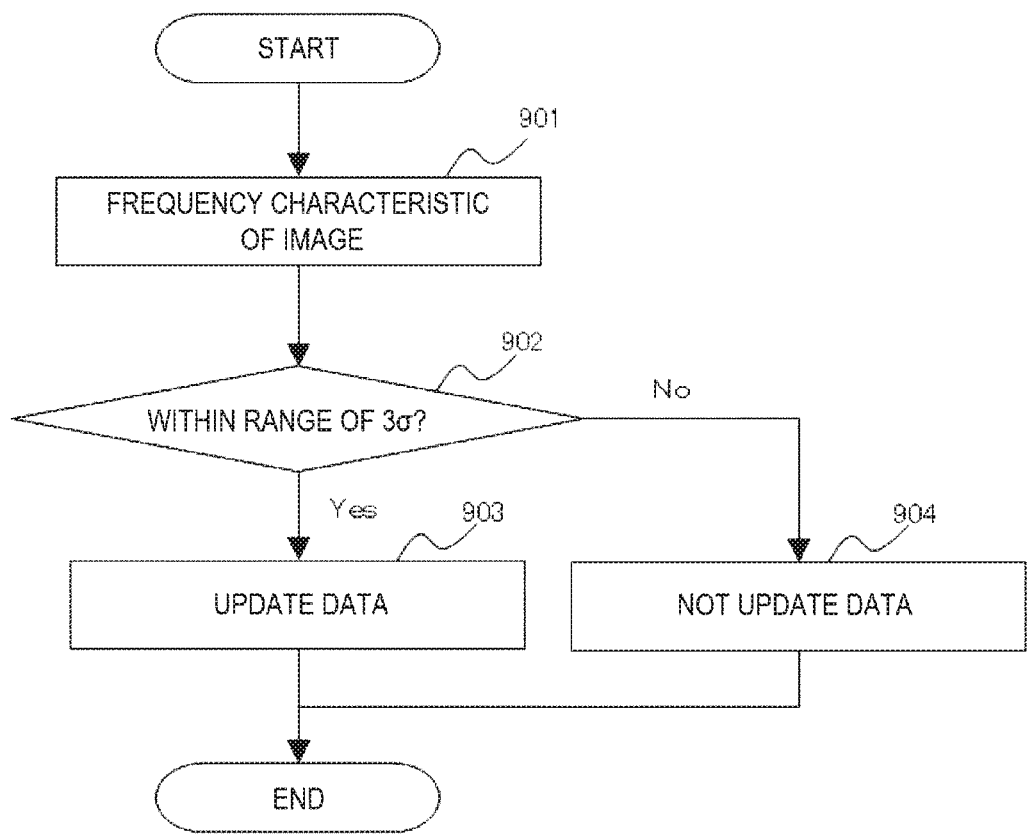
FIG. 8 is a flow chart showing an example of data update according to a tenth embodiment of the invention.

FIG. 8 is a flow chart showing an example of processing for updating data in the device A. Data in the database 700 may be updated each time optical conditions are changed. At this time, when acquiring an image disturbed by the influence of noise, disturbance or the like, for example, past data is accumulated, and an average value of frequency characteristics is held as a reference value. It is determined whether the frequency characteristic acquired this time (901) deviates by a standard deviation of 3σ from a reference value (902). If the deviation is within a range of 3σ, data is updated (903). If the deviation is beyond the range of 3σ, the data is excluded as an update target (904). The reference value for determination is not limited to the example.

Eleventh Embodiment

Figure 11:
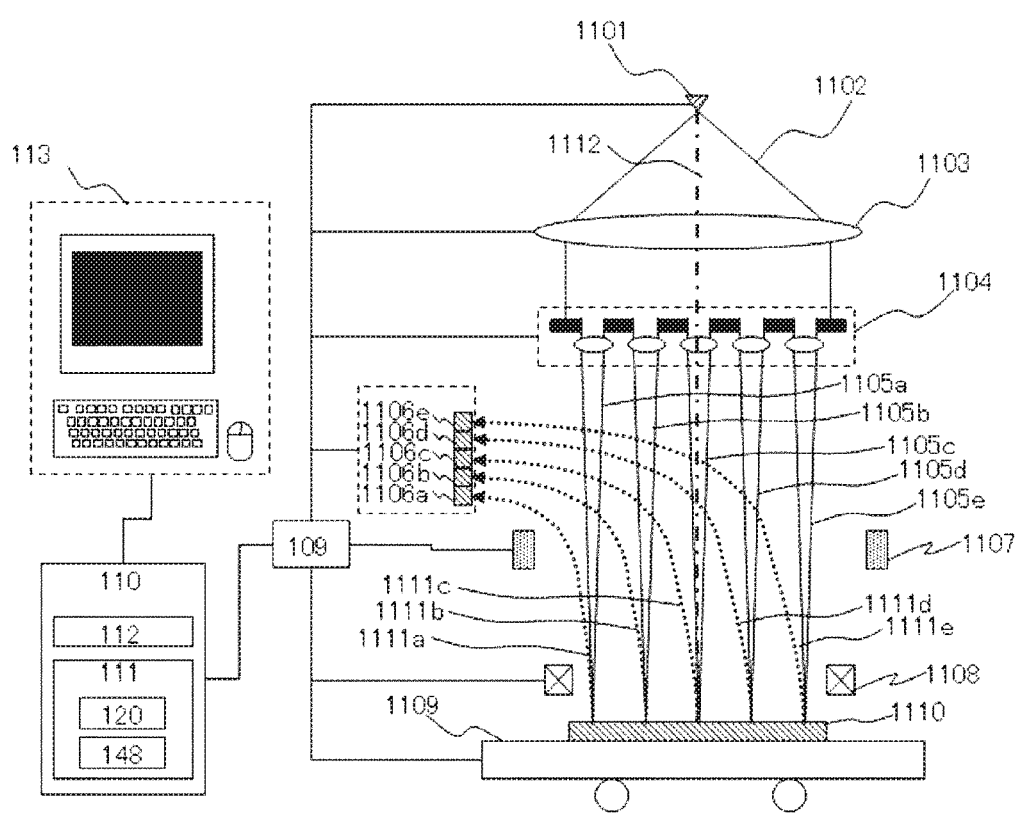
FIG. 11 is a block diagram showing an example of a scanning electron microscope according to an eleventh embodiment.

The first embodiment to the tenth embodiment show an example of a so-called single beam device, that is, there is one electron beam in the electron beam observation device. An eleventh embodiment shows an example in which the invention is applied to a so-called multi-beam device or a multi-column device, that is, there are two or more electron beams in the electron beam observation device as shown in FIG. 11.

In the multi-beam device or the multi-column device, a resolution of an image acquired by each of a plurality of electron beams passing through the device and a measurement result of a sample pattern using the image may vary. This is because a beam current, an aberration received by a lens, and the like are different for each electron beam. Here, as described in the first embodiment to the tenth embodiment, it is desirable that a difference (machine difference) in resolutions or in length measurement values between a plurality of devices is small. The same applies to a difference (electron beam difference) in resolutions or in length measurement values between electron beams in the multi-beam device or the multi-column device. Therefore, by applying the method of the invention applied to images acquired by a plurality of devices shown in the first embodiment to the tenth embodiment to images acquired by a plurality of electron beams in one multi-beam device or one multi-column device, the electron beam difference in the multi-beam device or the multi-column device can be reduced.

In the present embodiment, as a representative, a content in which a plurality of devices in the first embodiment is replaced with a plurality of electron beams will be shown. A content in which the electron beam difference in the multi-beam device or the multi-column device is reduced by replacing the plurality of devices with the plurality of electron beams is the same as those in the second embodiment to the tenth embodiment, and the description thereof is omitted here.

Hereinafter, although an example in which the electron beam observation device is a multi-beam device is shown in the present embodiment, the same applies to a multi-column device in which a plurality of columns exist in the same device.

FIG. 11 is a diagram showing a schematic configuration of an electron beam observation device according to the eleventh embodiment. First, a device configuration will be described. In a downstream direction (downward in the figure) where an electron source (electron gun) 1101 emits an electron beam (electron beam) 1102, a lens 1103, a multi-beam forming unit 1104, a detector array 1106, a beam separator 1107, and a deflector for scanning deflection 1108 are disposed. Further, an aligner for adjustment of a central axis (optical axis) of a primary beam, an aberration corrector and the like (not shown) are added to an electronic optical system. The lens 1103 may be any of an electromagnetic lens, an electrostatic lens, or a combination thereof that controls the focus by an excitation current. In the present embodiment, the multi-beam forming unit 1104 is a combination of an aperture array and a lens array, but the scope of the invention is not limited thereto. Further, in the present embodiment, the electron source is a single electron source 1101, but the invention does not lose the effect even when a plurality of electron sources exists so as to correspond to each electron beam of multi-beams. The detector array 1106 includes a plurality of detectors 1106a to 1106e therein.

A stage 1109 is configured to move with a wafer, that is, a sample 1110 placed thereon. The electron source 1101, the lens 1103, the multi-beam forming unit 1104, the detector array 1106, the beam separator 1107, the deflector for scanning deflection 1108, and the stage 1109 are connected to the control device 109. Further, the control device 109 is connected to a system control unit 110.

The system control unit 110 functionally includes a storage device 111 and a calculation unit 112. An input and output unit 113 including an image display device is connected to the system control unit 110. Further, although not shown in the figure, it goes without saying that constituent elements other than a control system and a circuit system are disposed in a vacuum container and are evacuated to operate. It goes without saying that a wafer transfer system configured to place a wafer on the stage 1109 from outside the vacuum is also included.

More specifically, the system control unit 110 includes a central processing unit as the calculation unit 112 and a storage unit as the storage device 111. The central processing unit serving as the calculation unit 112 described above executes a control program 120, an image processing unit 148 or the like stored in the storage device 111, so as to perform image processing related to defect inspection and dimensional measurement or control of the control device 109. The image processing unit 148 is a program for processing an SEM image.

In the first embodiment, the system control unit 110, the input and output unit 113, the control device 109, and the like are generally referred to as a control unit. Further, the input and output unit 113 may be configured such that an input member such as a keyboard or a mouse serves as the input unit, and a display member such as a liquid crystal display device serves as the input unit and the output unit separately, and the input and output unit may also be an integrated input and output unit utilizing a touch panel or the like.

Image observation performed by using the device according to the present embodiment will be described. The electron beam 1102 emitted from the electron source 1101 is adjusted into a substantially parallel beam by the lens 1103 and is incident on the multi-beam forming unit 1104 to become multi-beams (1105a to 1105e). Although the present embodiment shows an example in which the number of multi-beams is five (1105a to 1105e), the effect of the invention is not lost even when the number of beams is larger than or smaller than five. After passing through the beam separator 1107, the electron beams 1105a to 1105e which are the multi-beams are concentrated on the sample 1110 so that a beam diameter is extremely small while being deflected by the deflector for scanning deflection 1108.

The deflector for scanning deflection 1108 is controlled by the control device 109 such that each of the electron beams 1105a to 1105e which are the multi-beams scans a predetermined region of the sample 1110. The electron beams 1105a to 1105e which are the multi-beams and have arrived at a surface of the sample 1110, interact with materials in the vicinity of the surface. Accordingly, secondary electrons such as reflected electrons, secondary electrons and Auger electrons are generated from the sample and become a signal to be acquired. In the present embodiment, a case where the signal is a secondary electron is shown. Secondary electrons 1111a to 1111e generated from positions where the electron beams 1105a to 1105e which are the multiple beams reach the sample 1110 are orbit-separated from the electron beams 1105a to 1105e which are the multi-beams by the beam separator 1107, and are detected by each of a plurality of detectors 1106a to 1106e in the detector array 1106. Signal processing is performed on the secondary electrons 1111a to 1111e detected with the detector array 1106a to 1106e in synchronization with a scan signal sent from the control device 109 to the deflector for scanning deflection 1108, so that an image (SEM image) is formed and observation of the sample 1110 is conducted.

The generated image can be stored in the storage device 111 or a nonvolatile storage device (not shown). The image stored in a storage unit such as the storage device 111 or the nonvolatile storage device is processed by an image processing unit 148 to be described later.

Note that an arrangement order of the lens 1103, the multi-beam forming unit 1104, the detector array 1106, the beam separator 1107, and the deflector for scanning deflection 1108 shown in the present embodiment may be reversed, and an electron optical element other than that shown in FIG. 11 may be contained. Although not shown, an aligner for adjusting a position and an angle of the electron beam 1102 or the electron beams 1105a to 1105e which are the multi-beams is disposed between the electron source 1101 and the sample 1110. Correction is performed when a central axis of the electron beam 1102 or the electron beams 1105a to 1105e which are the multi-beams is shifted with respect to various electron optical elements.

Here, when a dimension of a pattern of the sample 1110 is measured from the image acquired by using the electron beams 1105a to 1105e which are the multi-beams, it is desirable that a difference (electron beam difference) between a plurality of devices in such as resolutions, probe current amounts, and critical dimension values is small. In an example in the related art, efforts have been made to reduce the electron beam difference to an allowable range through a hardware adjustment or a software adjustment of each component described in FIG. 11. However, a slight difference in a shape of the electron beam or the like may occur due to the influence of aging after use of the device or use environment or the like, and an electron beam difference may exceed the allowable range.

In the present embodiment, the electron beam difference between the electron beams 1105a to 1105e which are the multi-beams is reduced by image processing in the image processing unit 148 in FIG. 11. That is, a certain electron beam is determined as a reference electron beam, and an image acquired by an electron beam whose electron beam difference is reduced is corrected.

Here, the first embodiment shows an example in which a correction coefficient is calculated so as to match the device B with the device A using the device A as a reference device with reference to the flow chart in FIG. 2 or FIG. 5. In the present embodiment, by replacing an "image acquired by the device A or the device B" with an "image acquired by any of the electron beams 1105a to 1105e" in these flow charts, the electron beam difference can be reduced. Other than that, contents are all the same as those described in the first embodiment, and the description thereof is omitted here.

That is, when the electron beam 1105a is used as a reference electron beam and an electron beam difference with respect to an reference electron beam of an image acquired by the electron beam 1105b is reduced, by applying an image acquired by the electron beam 1105a as an image acquired by the device A and applying an image acquired by the electron beam 1105b as an image acquired by the device B, a correction coefficient for reducing the electron beam difference can be calculated (306 in FIG. 3). The electron beam difference between all the electron beams 1105a to 1105e which are the multi-beams in the electron beam observation device can be reduced.

Similarly to the first embodiment, in the present embodiment, it is of course within the scope of the invention to reduce a difference between images acquired with the same electron beam (for example, 1105a). For example, it is possible to deal with a case where the electron beam 1105a is treated as being changed with time.

In addition, even when an electron beam used when capturing an image by an electronic device other than the corresponding electron beam observation device is defined as a reference electron beam, a correction coefficient for the reference electron beam is obtained for all of the electron beams 1105a to 1105e which are the multi-beams, and all images are corrected, the effect of the invention is not lost.

Again, in the present embodiment, an image correction by the image processing unit 148 is performed based on a calculated correction coefficient calculated from each image captured with the electron beams 1105a to 1105e which are the multi-beams.

An image correction processing method may be according to, for example, an illustrative diagram shown in FIG. 3, similarly to the first embodiment.

Figure 12:
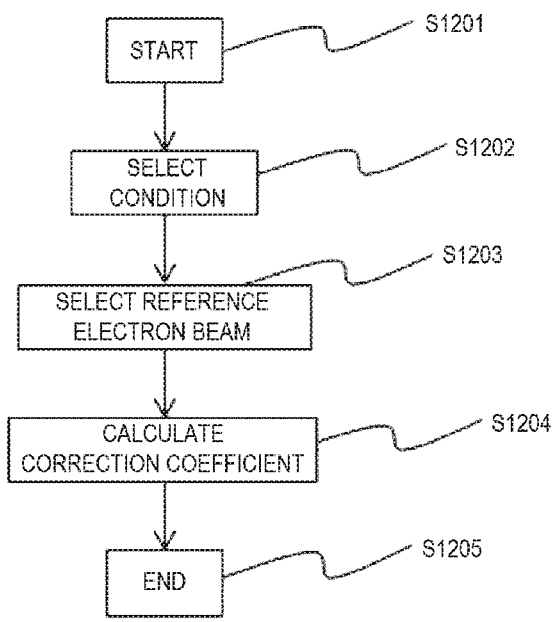
FIG. 12 is a flow chart for acquiring a correction coefficient for reducing an electron beam difference according to the eleventh embodiment.
Figure 13:
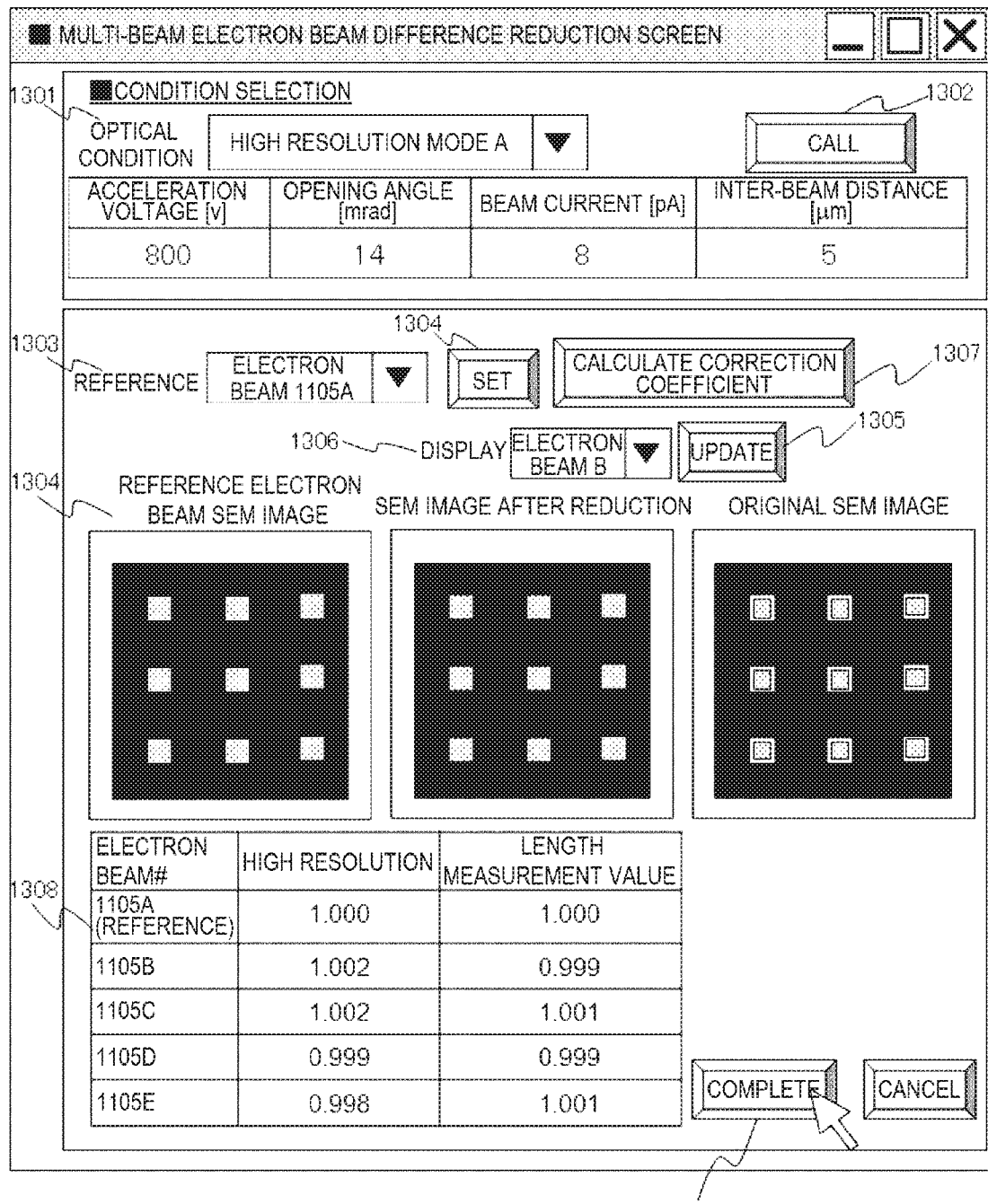
FIG. 13 is a screen for acquiring the correction coefficient for reducing an electron beam difference according to the eleventh embodiment.

Next, a procedure for acquiring the correction coefficient so as to reduce the electron beam difference between the multi-beams will be described with reference to FIGS. 12 and 13. FIG. 12 is a flow chart for acquiring a correction coefficient for reducing an electron beam difference. An operator starts acquiring the correction coefficient for reducing an electron beam difference via the input and output unit 113 including the image display device (step S1201 in FIG. 12). A multi-beam electron beam difference reduction screen shown in FIG. 13 appears on the image display device. Hereinafter, FIG. 13 will be referred to unless otherwise specified. When the operator selects an optical condition for reducing the electron beam difference from a pull-down menu of a condition selection unit 1301, conditions such as an acceleration voltage, an opening angle, a beam current, and an inter-beam distance which are stored in advance in the storage device 111 are reflected in the image display device. These optical conditions are merely examples, and these optical conditions are not necessarily contained in the optical conditions, and other optical conditions may be set therefor. The operator presses a condition call button 1302 to determine an optical condition (step S1202). The present embodiment shows an example in which the optical conditions are selected from the pull-down, but the optical conditions may be directly input. The optical conditions include a focus condition of a lens, a beam current of an electron beam, an opening angle, an acceleration voltage, and a result of an optical axis adjustment, and results adjusted and set in advance are stored in the storage device 111. When the condition is selected, a control signal is sent from the system control unit 110 to the device via the control device 109, and a desired optical condition is set up.

When a condition setting is completed, the operator selects a reference electron beam by a reference electron beam selection unit 1303 and presses a reference electron beam setting button as a preparation for the electron beam difference reduction (step 51203 in FIG. 12). The present embodiment shows a case where the electron beam 1105a is selected as the reference electron beam. As described above, as the reference electron beam, any electron beam in the corresponding electron beam observation device may be selected, an electron beam in an electron beam device other than the corresponding electron beam may be selected, or an electron beam used when an image captured in the past is acquired may be selected. An SEM image updated as needed is displayed on an SEM image display unit 1304. Further, each time an update button 1305 is pressed, an image is newly captured and updated. The present embodiment shows an example in which, as the SEM image, three types of an SEM image captured using the reference electron beam, an SEM image captured using the electron beam selected by the operator through a display electron beam selecting unit 1306, and an SEM image in which the electron beam difference is reduced by a method of the invention are displayed. The SEM image in which the reduced electron beam difference is reduced will be described later. An SEM image is also acquired for an electron beam not selected by the display electron beam selection unit 1306. Depending on a configuration of the screen, an example in which SEM images captured by all the electron beams are displayed may be considered.

Next, when the operator presses a correction coefficient calculation button 1307, a correction coefficient calculation is performed (step S1204). In the step, as described above, various calculation processing are performed through the calculation unit 112 and the image processing unit 148 according to the flow chart in FIG. 2 or FIG. 5 stored in the storage device 111, so that correction coefficients associated with each electron beam which is the multi-beam are calculated and temporarily stored in the storage device 111. Although the present embodiment shows an example in which the SEM images are simultaneously acquired by all the electron beams, and the correction coefficients are also calculated in parallel, the correction coefficients of each beam may be separately acquired depending on specifications of the calculation unit 112 or specifications of the reference sample 108. In the flow, although not specifically described with respect to the sample, a dedicated sample is permanently installed in the device, and a stage may automatically move to a corresponding sample position by calling a multi-beam electron beam difference reduction screen in FIG. 13.

When a correction coefficient calculation is completed, an electron beam difference display unit 1308 displays the electron beam difference after the electron beam difference is reduced after image processing is performed by a method that is based on FIG. 3 on the basis of the correction coefficient described above. In the present embodiment, the resolution and the length measurement value are taken as indexes indicating the electron beam difference, and values therefor indicate how many times they are relative to values of the SEM image of the reference electron beam. The index described above may be anything as long as the index represents an electron beam difference, and the effect of the invention is not lost even when the index is one other than the resolution and the length measurement value. Although an example in which the electron beam difference is displayed as a ratio with respect to the reference is shown, the effect of the invention is not lost even when other forms such as a comparison of absolute values are used. In the present embodiment, the SEM image display unit 1304 is updated at this time. With respect to the SEM image in which the electron beam difference is reduced, an image subjected to image processing by the method that is based on FIG. 3 is displayed on the basis of the correction coefficient described above. Although not specified in the present embodiment, the previously acquired correction coefficient is stored in the storage device 111 as a table of correction coefficients for electron beam difference reduction, and the correction coefficient is called in a reference electron beam selection step, and a value of the electron beam difference display unit 1308 is updated.

When the operator presses a completion button 1309 after confirming the electron beam difference reduction by the above flow, the table of the correction coefficient for reducing the electron beam difference is updated, and the electron beam difference reduction of the multi-beams is completed (S1205).

By creating the table of the correction coefficient for reducing the electron beam difference of the multi-beams in advance as described above, it is possible to perform the image processing by the method in FIG. 3 when observing a sample and performing measurement and inspection based on the observation, and it is possible to acquire an image in which the electron beam difference is reduced by real time or post-processing.

As described above, the electron beam difference in the multi-beam device or the multi-column device can be reduced.

<Overview>

The effect of the invention is not limited to a machine difference reduction between devices and a beam shape conversion, and is a widely effective invention when correcting an image in frequency space based on a captured image.

The invention is not limited to the embodiments described above and includes various modifications. For example, the above-described embodiments are described in detail for easy understanding of the invention, and the invention is not necessarily limited to those including all the configurations described above. Apart of the configuration of one embodiment can be replaced with the configuration of another embodiment, and the configuration of another embodiment can be added to the configuration of one embodiment. For a part of the configuration of each embodiment, addition, deletion, or replacement of another configuration may be applied alone or in combination.

Some or all of the above-described configurations, functions, processing units, processing means, and the like may be realized by hardware, for example, by designing an integrated circuit. The above-described components, functions, and the like may also be realized by software by a processor interpreting and executing programs that implement their respective functions. Information such as a program, a table, and a file that implements each function can be stored in a recording device such as a memory, a hard disk, a Solid State Drive (SSD), or in a recording medium such as an IC card, an SD card, or a DVD.

Control lines and information lines indicate what is considered necessary for explanation, and not all control lines and information lines in the products are shown. In practice, it may be considered that almost all the configurations are connected to each other.

The invention claimed is:

1. An electron beam observation device comprising:
   an electron source;
   an objective lens concentrating an electron beam emitted from the electron source; and
   a control unit configured to perform control such that a plurality of images is generated by capturing images of a reference sample having a specific pattern, and a frequency characteristic is calculated for each of the plurality of images, wherein
   an image is generated based on a secondary signal generated from a sample due to irradiation of the sample with the electron beam, and
   the control unit holds the plurality of frequency characteristics.

2. The electron beam observation device according to claim 1, wherein
   the frequency characteristic of the image includes an amplitude when the image is converted into a frequency space image.

3. The electron beam observation device according to claim 2, wherein
   the frequency characteristic is calculated by multiplication or division of a coefficient for each of coefficients generated when the image is converted into a frequency space image.

4. The electron beam observation device according to claim 1, wherein
   the control unit performs control such that a correction coefficient is calculated based on the plurality of frequency characteristics.

5. The electron beam observation device according to claim 4, wherein
   the plurality of frequency characteristics include a first frequency characteristic of the image of the reference sample acquired by another electron beam observation device, and a second frequency characteristic of the image of the reference sample calculated by the electron beam observation device.

6. The electron beam observation device according to claim 5, wherein
   the control unit performs control such that the image captured by the electron beam observation device is corrected with the correction coefficient.

7. The electron beam observation device according to claim 4, wherein
   the plurality of frequency characteristics include a first frequency characteristic of a first image of the reference sample captured in the past by the electron beam observation device, and a second frequency characteristic of a second image of the reference sample captured by the electron beam observation device newer than the first image, and
   the control unit performs control such that the image captured by the electron beam observation device is corrected with the correction coefficient.

8. The electron beam observation device according to claim 4, wherein
   the plurality of frequency characteristics include a first frequency characteristic of a first image of the reference sample captured under a first optical condition, and a second frequency characteristic of a second image of the reference sample captured under a second optical condition.

9. The electron beam observation device according to claim 8, wherein
   the first image and the second image are images whose total dose amount satisfies a predetermined reference.

10. The electron beam observation device according to claim 8, wherein
    the control unit performs control such that the first image and the second image are captured for a plurality of times, a plurality of first frequency characteristics and a plurality of second frequency characteristics are calculated so as to calculate a plurality of correction coefficients, and an average of the plurality of correction coefficients is used.

11. The electron beam observation device according to claim 1, wherein
the control unit performs control such that a frequency characteristic beyond a predetermined reference is excluded from targets being held.

12. The electron beam observation device according to claim 1, wherein
the control unit holds a numerical sequence indicating the frequency characteristic of the electron beam observation device.

13. An electron beam observation system, comprising:
a plurality of electron beam observation devices; and
a controller connected to the plurality of electron beam observation devices, wherein
the electron beam observation device includes:
an electron source;
an objective lens concentrating an electron beam emitted from the electron source; and
a control unit configured to perform control such that a plurality of images is generated by capturing images of a reference sample having a specific pattern, and a frequency characteristic is calculated for each of the plurality of images, in which
an image is generated based on a secondary signal generated from a sample due to irradiation of the sample with the electron beam, and
the control unit holds the plurality of frequency characteristics, and
the controller is configured to provide a reference frequency characteristic to the plurality of electron beam observation devices.

14. A control method of an electron beam observation device,
the electron beam observation device including:
an electron source; and
an objective lens concentrating an electron beam emitted from the electron source, and
an image being generated based on a secondary signal generated from a sample due to irradiation of the sample with the electron beam,
the control method of the electron beam observation device comprising:
a first step of generating, by the electron beam observation device, a plurality of images by capturing images of a reference sample having a specific pattern;
a second step of calculating, by the electron beam observation device, a frequency characteristic for each of the plurality of images; and
a third step of holding, by the electron beam observation device, the plurality of frequency characteristics.

15. An electron beam observation device that generates an image based on a secondary signal generated from a sample due to irradiation of the sample with a plurality of electron beams, the electron beam observation device comprising:
a control unit configured to perform control such that a plurality of images is generated by capturing images of a reference sample having a specific pattern by the plurality of electron beams, and a frequency characteristic is calculated for each of the plurality of images, wherein
the control unit holds the plurality of frequency characteristics.

16. The electron beam observation device according to claim 15, wherein
the control unit performs control such that a correction coefficient is calculated based on the plurality of frequency characteristics.

* * * * *